Feb. 24, 1953 H. NELSON ET AL 2,629,767

SEMICONDUCTOR AMPLIFIER OR OSCILLATOR DEVICE

Filed Aug. 31, 1949

Inventors
Bernard N. Slade
& Herbert Nelson

By H. L. Newton
Attorney

Patented Feb. 24, 1953 2,629,767

UNITED STATES PATENT OFFICE 2,629,767

SEMICONDUCTOR AMPLIFIER OR OSCILLATOR DEVICE

Herbert Nelson, Bloomfield, and Bernard N. Slade, Morristown, N. J., assignors to Radio Corporation of America, a corporation of Delaware Application August 31, 1949, Serial No. 113,304

8 Claims. (Cl. 175—366)

This invention relates generally to semi-conductor devices, and particularly relates to semi-conductor amplifier or oscillator devices having improved high frequency characteristics.

The three-electro semi-conductor has recently been developed as an amplifier or oscillator. This device, which has been termed a "transistor," has been disclosed in a series of three letters to the Physical Review by Bardeen and Brattain, Brattain and Bardeen, and Shockley and Pearson which appear on pages 230 to 233 of the July 15, 1948, issue. The new amplifier includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conducting material. This amplifier provides voltage as well as current gain under proper operating conditions and may be considered as a three-terminal network having a common input and output terminal. Thus, the device is effectively a four-terminal network having a common input and output electrode which may, for example, be the base electrode.

It is well known that a conventional transistor has an upper frequency limit in the neighborhood of 10 mc. (megacycles). Thus, when the device is used as an amplifier, its gain drops appreciably for signal frequencies in the megacycle region. This is believed to be due at least in part to the transit time spread of the carriers of electric charges. In an N type semi-conductor which may, for example, consist of germanium and which is assumed to have a P type surface layer, the charge carriers on the surface consist of holes. On the other hand, if the semi-conductor is of the P type which is assumed to have an N type surface layer, the charge carriers are electrons. The transit time of the charge carriers is a function of the spacing and of the voltage applied between the emitter and collector electrodes and is also believed to depend on the thickness of the crystal. Due to the difference of the paths of the charge carriers flowing between the emitter and collector electrodes, there will exist a transit time spread and its effect becomes more pronounced as the signal frequency increases.

It has been found that this transit time spread causes a reduction of the magnitude of the output signal which is equivalent to a reduction of the amplifier gain and is accompanied by an increase of the resistance loading of the input circuit. The resistance of a three-electrode semi-conductor looking into the base electrode under normal operating conditions is negative at low frequencies. However, at high signal frequencies the resistance looking into the base electrode normally becomes positive and may be quite low. This decrease of the input resistance is due to a phase shift between the alternating input and output currents or voltages. Thus, it seems reasonable to assume that if the transit time and particularly the transit time spread of the charge carriers is reduced, the frequency response of the device may be improved.

The copending application to Loy E. Barton, filed on July 26, 1949, Serial No. 106,926, entitled "High Frequency Response Semi-Conductor Device," which is assigned to the assignee of this application, discloses a semi-conductor device having improved high frequency characteristics. To this end, the thickness of the semi-conductor crystal is made no more than 5 mils. However, difficulties are experienced in providing a germanium crystal having a thickness of less than 5 mils. Usually, an appreciably thicker crystal must be ground to the desired dimensions, which consumes considerable time. On the other hand, if a layer of germanium is evaporated on a suitable support, the performance of such a device is not very good.

It is, accordingly, the principal object of the present invention to provide a semi-conductor device suitable as an amplifier or oscillator having an improved high frequency response and wherein the semi-conducting crystal need not be very thin.

A further object of the invention is to provide a three-electrode semi-conductor device where all three electrodes are provided closely adjacent to each other on the same surface of the semi-conducting crystal thereby to reduce the phase shift between high frequency alternating input and output currents and to improve generally the high frequency characteristics of the device.

Another object of the invention is to provide a semi-conductor oscillator or amplifier device which exhibits the desirable high frequency characteristics of a device having a very thin semi-conducting crystal without requiring such a thin crystal.

In accordance with the present invention, a preferably plane surface of a semi-conducting crystal is covered or coated with a metallic layer with the exception of a predetermined surface area thereby to provide contiguous and semi-conductive surface portions. This uncoated or semi-conductive surface area is provided with two small-area electrodes in contact with the crystal. The metallic layer serves as a base electrode of the device while the two small-area electrodes may be connected as the emitter and collector electrodes. Accordingly, all three electrodes of the device are provided on the same surface of the crystal. The metallic coating may cover the entire surface of the crystal with the exception of a small surface area and contact may be made to the coating by sweating or soldering a metallic stud thereto. The small-area electrodes may be point electrodes. Alternatively, the semi-conducting crystal may have a straight edge across which two metallic ribbons extend to provide small-area contacts with the crystal.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
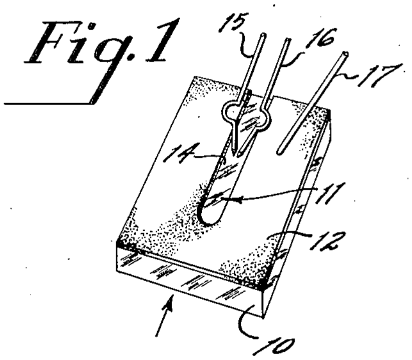
Figure 1 is a view in perspective of a semi-conductor device embodying the present invention.
Figure 2:
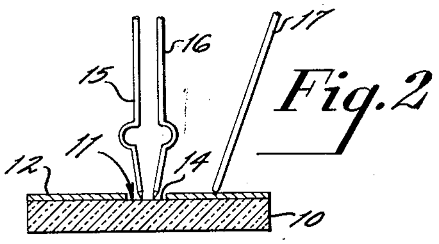
Figure 2 is a sectional view of the device of Figure 1 taken in the direction indicated by arrow 2 of Figure 1.

Referring now to the drawing in which like components have been designated by the same reference numerals throughout the figures, and particularly to Figures 1 and 2, there is illustrated a semi-conductor device embodying the present invention which may be used as an amplifier, oscillator or the like. The device comprises a block 10 of semi-conducting material consisting, for example, essentially of a chemical element having semi-conducting properties such as germanium, silicon, boron, tellurium, or selenium containing a small but sufficient number of atomic impurity centers or lattice imperfections as commonly employed for best results in crystal rectifiers. Germanium is the preferred material for block 10 and may be prepared so as to be an electronic N type semi-conductor crystal as is well known. The top surface 11 of semi-conducting block 10 may be polished and etched in the manner explained in the paper by Bardeen and Brattain referred to. It is also feasible to utilize the germanium block from a commercial high-back-voltage germanium rectifier such as the type 1N34.

As clearly shown in Figures 1 and 2, semi-conducting block 10 has a plane top surface 11. In accordance with the present invention, surface 11 is provided or coated with a metallic layer or film 12 with the exception of a predetermined surface area 14. Metallic layer 12 may, for example, be provided by electro-plating body 10 with a suitable metal. To this end, surface 11 of crystal 10 may be immersed in a copper cyanide bath. This bath may, for example, consist of an aqueous solution containing 3.0 ounces of copper cyanide, 4.5 ounces of sodium cyanide and 2.0 ounces of sodium carbonate per gallon of water. The predetermined area 14 may be covered with a suitable material such, for example, as wax to prevent the deposition of copper thereon. When electric current is passed through the solution with body 10 serving as one of the electrodes, a copper layer or film will be deposited over that portion of the surface which is not covered with wax.

The uncoated surface area 14 is now provided with two closely adjacent point electrodes 15 and 16 which may, for example, consist of thin wires preferably of Phosphor bronze having sharp points clearly shown in Figure 2. Electrodes 15, 16 may have a distance of approximately 2 mils or less. Electric contact may be made with metallic layer 12 by an electric conductor 17 which may, for example, consist of a stiff wire having a rounded tip which is clearly illustrated in Figure 2.

Metallic layer 12 may be made the base electrode of a three-electrode semi-conductor device. Electrodes 15 and 16 may be made the emitter and collector electrodes of the device.

It is to be understood that metallic layer 12 may be applied in any suitable manner provided it forms a low-resistance, non-rectifying contact with body 10. Furthermore, electrodes 15 and 16 may assume various forms provided they will form high-resistance, rectifying contacts with semi-conducting body 10.

Figure 3:
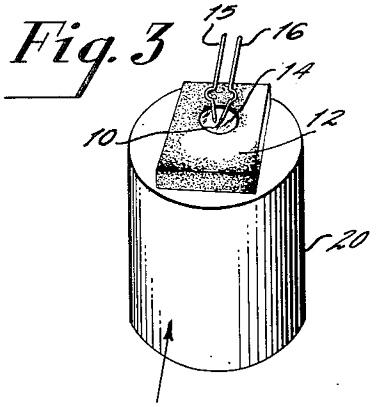
Figure 3 is a view in perspective of a modified semi-conductor device in accordance with the invention.
Figure 4:
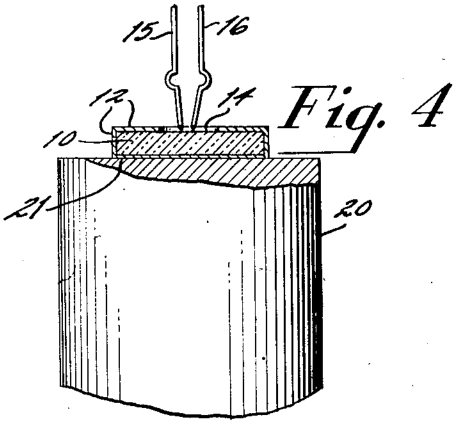
Figure 4 is a side elevational view of the device of Figure 3 taken in the direction illustrated by arrow 4 of Figure 3, with parts broken away.

Figures 3 and 4 illustrate a modified device in accordance with the invention. Semi-conducting body 10 has substantially its entire surface coated with metallic layer 12 as clearly shown in Figure 4. However, a surface area 14 is left without the metallic coating. A metallic stud 20 which may, for example, consist of brass is soldered or sweated to the metallic coating 21 provided on the lower surface of body 10. In this manner, electrical contact may be made with metallic coating 12.

Small-area electrodes 15 and 16 are provided in contact with body 10 on the surface area 14 which does not have a metallic coating. Electrodes 15 and 16 preferably are spaced a distance of approximately 2 mils or less. The distance between electrodes 15, 16 and the edge of coating 12 may amount to 10 mils or less. Electrodes 15 and 16 preferably consist of Phosphor bronze and are electrically formed to increase the gain of the device.

It has been found that a device as illustrated in Figures 3 and 4 having Phosphor bronze electrodes 15 and 16 which are electrically formed has a power gain of 25 db (decibels) or more. Such a device readily oscillates at a frequency of 1.5 mc. and exhibits a negative resistance at that frequency looking into the base electrode. The shift in frequency caused by the phase shift at a frequency of 1.5 mc. between the alternating input and output currents was either zero or no more than 10 kc. (kilocycles). It has also been found that if metallic coating 12 is removed from the device and if it is operated in a conventional manner, the device does not oscillate any more at a frequency of 1.5 mc. and the resistance looking into the base electrode is positive instead of being negative. This is believed to indicate that the improved high frequency performance is due to the coating 12.

The provision of metallic coating 12 permits to provide all three electrodes of the device on the same surface of body 10. The currents through body 10 are believed to flow through an extremely thin surface layer of the crystal so that the construction in accordance with the present invention effectively provides a device having an extremely thin semi-conducting layer.

Figure 5:
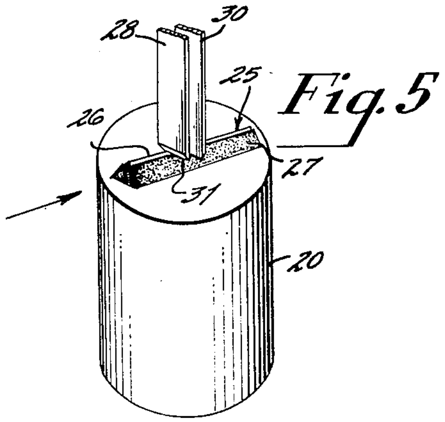
Figure 5 is a view in perspective of another modification of a semi-conductor device of the invention provided with ribbon-like electrodes extending across an edge of the crystal.
Figure 6:
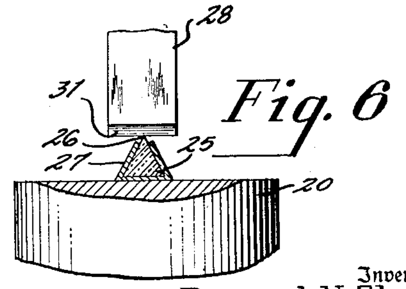
Figure 6 is a side elevational view of the device of Figure 5 taken in the direction shown by arrow 6 of Figure 5, parts being broken away.

Still another modification of the semi-conductor device of the invention is illustrated in Figures 5 and 6. Semi-conducting body 25 is prismatic. Accordingly, a straight edge 26 is provided on the body. The actual shape of body 25 is immaterial as long as it has a substantially straight edge. Body 25 is again coated in the manner previously described with a metallic layer 27 which covers substantially the entire surface of the body with the exception of edge 26 and its adjacent surface areas as clearly shown in Figures 5 and 6.

Two metallic ribbons 28 and 30 extend substantially at right angles across edge 26. Ribbons 28 and 30 are wedge-shaped or beveled at 31, that is, where they contact edge 26. Electrodes 28 and 30 effectively have small-area contacts with body 25. The operation of the device of Figures 5 and 6 is the same as that of the device shown in the figures previously described.

There has thus been disclosed a semi-conductor device suitable as an amplifier or oscillator with improved high frequency characteristics. The device in accordance with the invention will oscillate at higher frequencies than conventional devices. The phase shift between the alternating input and output currents is small or negligible at frequencies as high as 1.5 mc. and the device exhibits negative resistance at that frequency looking into the base electrode.

What is claimed is:

1. A semi-conductor device comprising a semi-conducting body having contiguous conductive and semi-conductive surface portions, and a plurality of small-area electrodes in contact with a semi-conductive surface portion and disposed closely adjacent to each other and to said conductive surface portions.

2. A semi-conductor device comprising a semi-conducting body having a substantially plane surface, a major portion of said plane surface being provided with a metallic film, said surface having a remaining semi-conductive portion, two small-area electrodes in contact with said remaining surface portion and disposed closely adjacent to each other and to said metallic film, and means for electrically contacting said film.

3. A semi-conductor device comprising a semi-conducting body having a substantially plane surface, a major portion of said plane surface being provided with a metallic coating, the remaining portion of said surface being semi-conductive, two small-area electrodes provided closely adjacent to each other in contact with said remaining semi-conductive surface portion and disposed closely adjacent to said metallic coating, and a conductive member for electrically contacting said coating.

4. A semi-conductor device comprising a semi-conducting body, a metallic coating covering the major portion of the entire surface of said body, thereby to provide a contiguous semi-conducting surface area, a conducting member in electric contact with said coating, and two small-area electrodes in contact with said semi-conductive surface area and disposed closely adjacent to each other and to said metallic coating.

5. A semi-conductor device comprising a semi-conducting body, a metallic film covering the major portion of the entire surface area of said body, said body having an uncovered semi-conductive surface area, a metallic member in electric contact with said film, and two closely adjacent small-area electrodes in contact with said semi-conductive surface area and disposed closely adjacent to said metallic film.

6. A semi-conductor device comprising a semi-conducting body, said body having a substantially straight edge and being provided with a metallic coating covering substantially its entire surface with the exception of said edge and its adjacent surface areas, a conductive member contacting said coating, and two substantially parallel metallic ribbons extending across said edge, said ribbons forming small-area contacts with said body.

7. A semi-conductor device comprising a substantially prismatic semi-conducting body, said body being provided with a metallic film covering substantially its entire surface with the exception of an edge thereof and its adjacent surface areas, a conductor contacting said film, and two substantially parallel metallic ribbons extending substantially at right angles across said edge, said ribbons forming small-area contacts with said body.

8. A semi-conductor device comprising a substantially prismatic semi-conducting body, said body being provided with a metallic layer covering substantially its entire surface with the exception of an edge thereof and its adjacent surface areas, a metallic member contacting said layer, and two substantially parallel metallic ribbons extending substantially at right angles across said edge, said ribbons having wedge-shaped portions in contact with said edge and forming small-area contacts with said body.

HERBERT NELSON.
BERNARD N. SLADE.

REFERENCES CITED

The following references are of record in the file of this patent:

UNITED STATES PATENTS

| Number | Name | Date |
|---|---|---|
| 888,191 | Pickard | May 19, 1908 |
| 1,708,571 | Hartmann | Apr. 9, 1929 |
| 2,402,662 | Ohl | June 25, 1946 |
| 2,476,323 | Rack | July 19, 1949 |
| 2,486,776 | Barney | Nov. 1, 1949 |